United States Patent [19]

Yamamoto et al.

[11] Patent Number: 5,079,430
[45] Date of Patent: Jan. 7, 1992

[54] ULTRAVIOLET RADIATION PROJECTOR AND OPTICAL IMAGE FORMING APPARATUS

[75] Inventors: Masanobu Yamamoto, Kanagawa; Nobutomo Umeki, Chiba; Katsutoshi Ohno; Kazumine Itoh, both of Tokyo, all of Japan

[73] Assignee: Sony Corporation, Tokyo, Japan

[21] Appl. No.: 499,943

[22] Filed: Mar. 27, 1990

[30] Foreign Application Priority Data

May 1, 1989 [JP] Japan ................................. 1-112503

[51] Int. Cl.$^5$ ............................................ G03B 27/00
[52] U.S. Cl. ..................................... 250/492.1; 355/20
[58] Field of Search ........................... 250/492.1, 492.2; 355/20

[56] References Cited

U.S. PATENT DOCUMENTS

| | | | |
|---|---|---|---|
| 4,498,009 | 2/1985 | Reynolds | 250/492.1 |
| 4,511,925 | 4/1985 | MacKenroth | 355/20 |
| 4,616,926 | 10/1986 | DiPietro et al. | 355/20 |
| 4,922,284 | 5/1990 | Dwyer | 355/20 |
| 4,924,254 | 5/1990 | Dwyer | 355/20 |
| 4,980,563 | 12/1990 | George et al. | 250/492.2 |
| 5,025,166 | 6/1991 | Miyato et al. | 250/492.1 |

Primary Examiner—Bruce C. Anderson
Attorney, Agent, or Firm—Philip M. Shaw, Jr.

[57] ABSTRACT

An ultraviolet radiation projector of this invention includes a focusing optical member arranged between an exposure surface of an ultraviolet sensitive material and a panel surface of a CRT for emitting an ultraviolet beam to expose the exposure surface which is kept separated from the focusing optical member, thereby preventing contact between the exposure surface and the focusing optical member. An optical image forming apparatus of this invention can form a high-precision two-dimensional image for an electronic circuit pattern by exposing the exposure surface with a pattern corresponding to a desired electronic circuit pattern using the ultraviolet radiation projector as a light source. In addition, sheet-like resins cured by the exposure with the ultraviolet beam using the ultraviolet radiation projector as a light source are sequentially stacked to form a desired high-precision three-dimensional image.

4 Claims, 6 Drawing Sheets

ULTRAVIOLET RADIATION PROJECTOR AND OPTICAL IMAGE FORMING APPARATUS

BACKGROUND OF THE INVENTION

1. Field of the Invention

The present invention relates to a new ultraviolet radiation projector and a new optical image forming apparatus. More specifically, the present invention relates to an ultraviolet radiation projector serving as a light source for exposing an ultraviolet sensitive material and an optical image forming apparatus for forming a desired two- or three-dimensional image by using the ultraviolet radiation projector.

2. Description of the Prior Art

An optical image forming method is one of the conventional methods of forming desired images. For example, a liquid or sheet-like synthetic resin (to be referred to as a photosensitive resin hereinafter) cured or decomposed upon radiation of an ultraviolet beam is positively or negatively exposed with an ultraviolet beam having a predetermined wavelength to form a desired image on the photosensitive resin.

A conventional apparatus includes a light source such as ultraviolet emission type CRT for image forming. A focusing optical member is inserted between a panel surface of the CRT and a surface of the photosensitive resin, whereby an ultraviolet beam from the emission surface of the CRT is focused onto the surface of the photosensitive resin through the focusing optical member to expose the photosensitive resin.

An example of the above apparatus is described in Japanese Patent Laid-Open No. 288844/1987.

The optical image forming apparatus described in the prior art mentioned above has the following problems. In this conventional optical image forming apparatus, a light guide is arranged on the emission surface of the CRT to collimate the ultraviolet beam, and a photosensitive resin is supplied to an output end face of the light guide, so that flatness of the output end face of the light guide directly determines precision of an image to be formed. For this reason, very high working precision of the output end face is required. For example, when the photosensitive resin cured remains attached to the output end face, the image pattern formed is not only damaged, an image to be formed upon supply of a new photosensitive resin material is but also damaged, furthermore the cured resin left on the output end face adversely affects the ultraviolet beam optically. In addition, a temperature difference inevitably occurs between the photosensitive resin and the panel surface of the CRT due to their contact. An application for the CRT is limited by the temperature difference.

OBJECT AND SUMMARY OF THE INVENTION

It is an object of the present invention to provide an ultraviolet radiation projector and an optical image forming apparatus, capable of exposing an exposure surface to an ultraviolet beam while the exposure surface is always kept separated from an optical member of the projector, perfectly preventing a photosensitive material from receiving an adverse influence of surface precision of the optical member, perfectly preventing the photosensitive material from being attached on the optical member, assuring high-precision exposure to the exposure surface, and minimizing limitations as to temperature conditions or the like on a CRT.

In order to achieve the above object of the present invention, according to the first feature of the present invention, there is provided an ultraviolet radiation projector comprising a CRT having a phosphor panel surface applied with a phosphor excited upon collision of electron beams from an electron gun to emit an ultraviolet beam having a wavelength of not more than 450 nm, and a focusing optical member arranged between the phosphor panel surface of the CRT and an exposure surface of an ultraviolet sensitive material irradiated with the ultraviolet beam, the focusing optical member being kept separated from the exposure surface.

The focusing optical member comprises a combination of a plurality of lenses or a gradient index lens array.

According to the second feature of the present invention, there is provided an optical image forming apparatus comprising an ultraviolet radiation projector of the first feature and image processing means for outputting image data corresponding to a predetermined electronic circuit pattern on the CRT, wherein the electronic circuit pattern is formed on the exposure surface of the ultraviolet sensitive material (for example, dry film applied on a plating layer formed on a board) irradiated with the ultraviolet beam emitted from the CRT.

The optical image forming apparatus preferably includes focusing means comprising a test signal output means for outputting a spatial frequency measuring pattern signal onto the CRT, pattern detecting means for detecting a spatial frequency measuring pattern image radiated from the CRT, driving means for moving the ultraviolet radiation projector or the focusing optical member in a direction perpendicular to the exposure surface of the ultraviolet sensitive material, and a focus control circuit for evaluating spatial frequency characteristics in accordance with an output signal from the pattern detecting means and for outputting a drive control signal to the driving means. The electronic circuit pattern can be auto-focused on the exposure surface by the above focusing means.

According to the third feature of the present invention, there is provided an optical image forming apparatus for forming a stereoscopic image and comprising the ultraviolet radiation projector of the first feature, image processing means for sequentially outputting data onto the CRT, said data corresponding to a large number of division sections obtained by dividing a predetermined stereoscopic image into the sections at every pitch in one direction, and supplying means for supplying newly the ultraviolet sensitive material having a thickness corresponding to the one pitch onto the exposure surface cured by exposure with the ultraviolet beam every time the exposure corresponding to the one division section is completed. The cured exposure surfaces corresponding to the respective division sections are sequentially stacked to form a predetermined stereoscopic image.

The supplying means comprises a storage unit for storing a liquid ultraviolet sensitive material, vertically movable elevator means having a stage with the same level as a liquid surface of the ultraviolet sensitive material in the storage unit, driving means for driving the elevator means stepwise, and control means for controlling to drive the driving means every time the exposure for each division section is completed.

The ultraviolet sensitive material may consist of a liquid ultraviolet curing resin. The optical image forming apparatus capable of forming a stereoscopic image may comprise the focusing means provided preferably in the second feature of the present invention.

DETAILED DESCRIPTION OF THE PREFERRED EMBODIMENTS

Preferred embodiments of the present invention will be described in detail with reference to the accompanying drawings.

Figure 1:
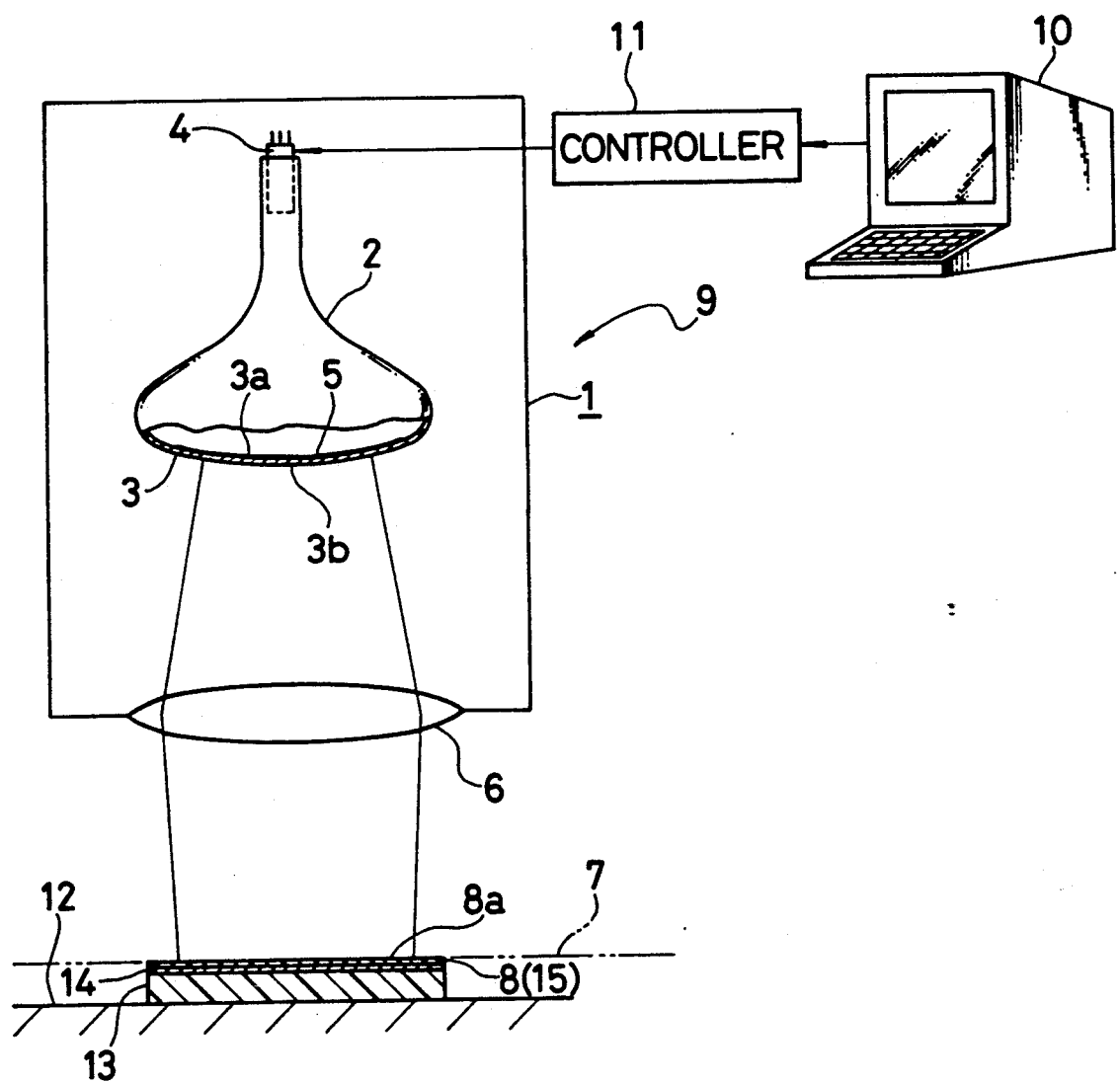
FIG. 1 is a view showing the overall arrangement of an optical image forming apparatus for forming an electronic pattern for a preferred embodiment according to the second feature of the present invention, the apparatus being provided with an ultraviolet radiation projector of a preferred embodiment according to the first feature of the present invention.
Figure 2:
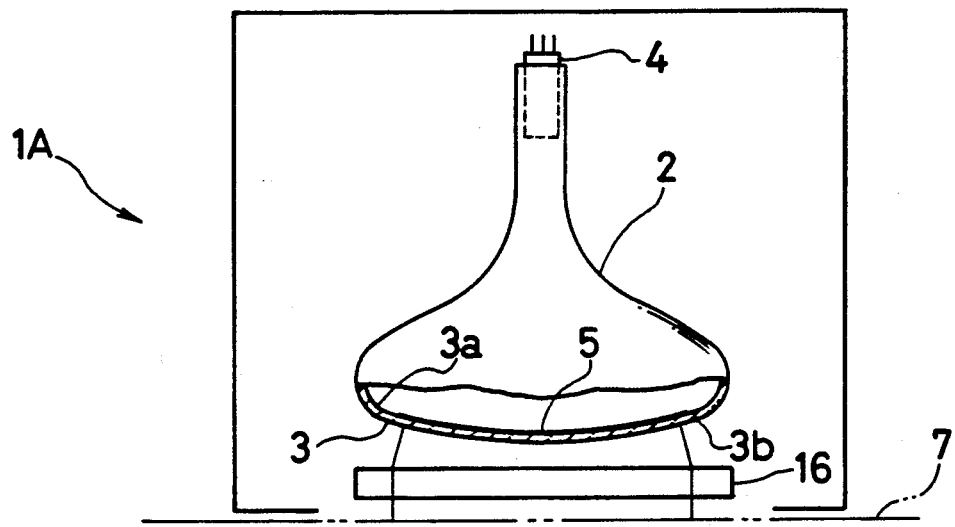
FIG. 2 is a view for explaining the ultraviolet radiation projector of another preferred embodiment according to the first feature of the present invention.
Figure 3:
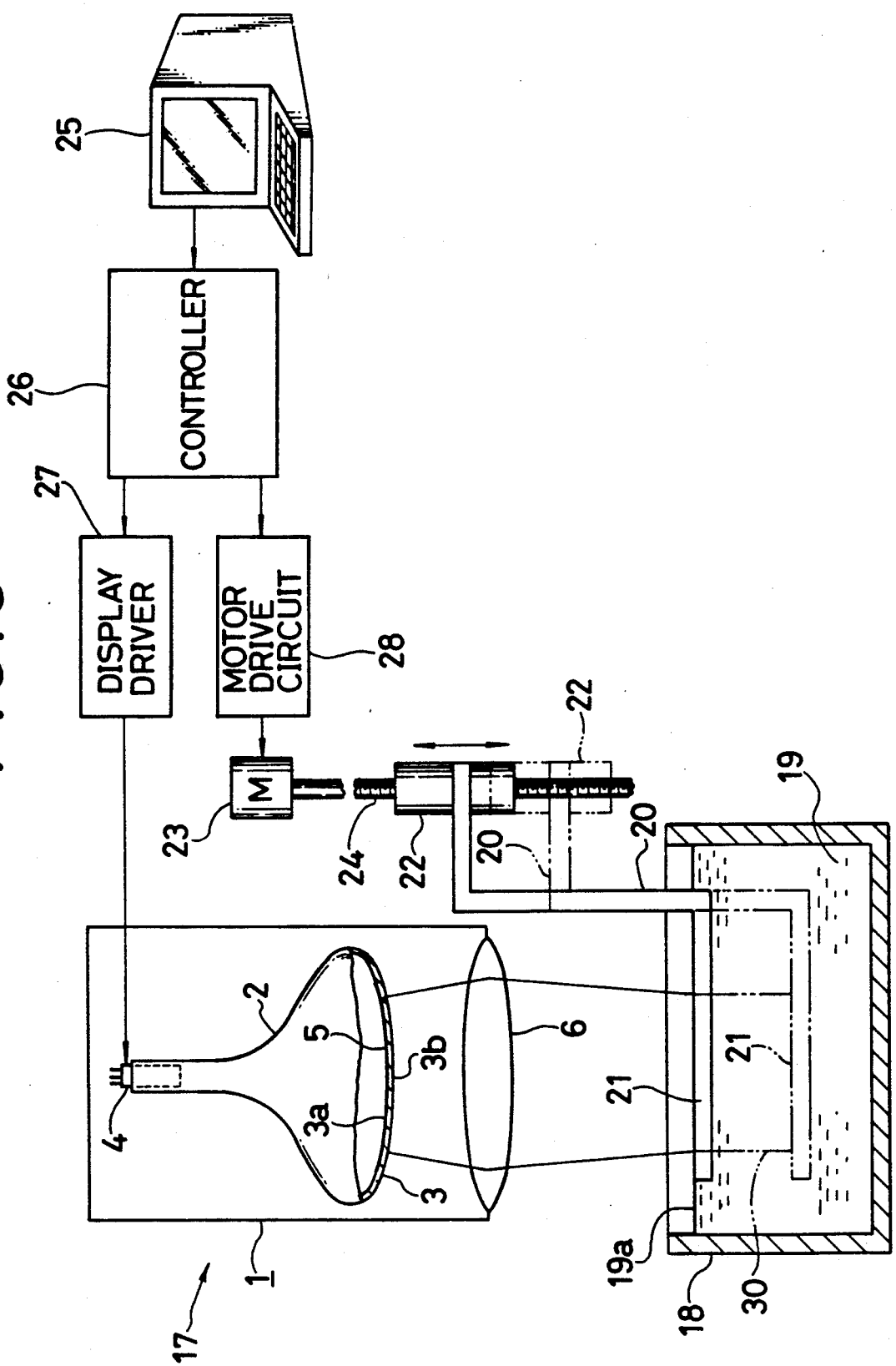
FIG. 3 is a view for explaining the overall arrangement of an optical image forming apparatus for forming a stereoscopic image for a preferred embodiment according to the third feature of the present invention.

FIGS. 1 to 3 show a preferred embodiment of an ultraviolet radiation projector and a preferred embodiment of an electronic circuit pattern image forming apparatus having said ultraviolet radiation projector.

As shown in FIG. 1, an ultraviolet radiation projector 1 comprises a CRT 2 and a projection lens 6 as a focusing optical member.

A panel portion 3 of the CRT 2 preferably consists of glass having a high transmittance of an ultraviolet beam. For instance, the glass is a conventional blue or white glass plate. The material for the panel portion 3 preferably has almost the same linear expansion coefficient as that of the material for a funnel portion.

A phosphor 5 is applied to a phosphor panel surface 3a of the inner surface of the panel portion 3. An electron beam emitted from an electron gun 4 in the CRT collides with the phosphor panel surface 3a so that the phosphor 5 emits an ultraviolet beam having a wavelength of 450 nm or less.

The projection lens 6 serving as a focusing optical member is arranged in front of the panel portion 3 and comprises a combination of various correction lenses. The projection lens 6 is also made of a material having a high transmittance of the ultraviolet beam. This material is exemplified by quartz glass or white plate glass.

An image pattern of an ultraviolet beam appearing on an output surface (panel surface) 3b of the panel portion 3 is focused onto a projection surface 7 at a position (indicated by a chain line with two dots in FIG. 1) spaced from the projection lens 6 by a focal length. When an ultraviolet sensitive material, i.e., a synthetic resin 8 (to be referred to as a photosensitive resin hereinafter) cured or decomposed upon radiation of an ultraviolet beam having a wavelength of 450 nm or less, is located on the projection surface 7, an exposure surface 8a of the photosensitive resin 8 is exposed to have a desired image pattern.

A magnification of the projection lens 6 is set to be an appropriate value, i.e., about ½ to several times in consideration of the brightness and resolution of the CRT 2.

The photosensitive resin 8 is always exposed under the condition of being kept separated from the projection lens 6. For this reason, the photosensitive resin 8 is free from an influence of surface precision of the projection lens 6 and is not attached to the projection lens 6.

An electronic circuit pattern image forming apparatus 9 (FIG. 1) having the ultraviolet radiation projector 1 as its light source is an apparatus for forming a dry film pattern used in the manufacture of printed circuit boards.

The electronic circuit pattern image forming apparatus 9 comprises an image processor 10 serving as a main unit in a so-called CAD system, and a controller 11 arranged between the image processor 10 and the electron gun 4 in the CRT 1. Data corresponding to any electronic circuit pattern designed by the image processor 10 is output to the electron gun 4 through the controller 11 as a video signal. A desired electronic circuit pattern image is projected onto the projection surface 7 by the ultraviolet radiation projector 1.

A work table 12 is located near the projection surface 7, and a board 13 is fed onto the work table 12. A plating layer 14 is formed on one surface of the board 13. A dry film 15 consisting of the photosensitive resin having a predetermined thickness is formed on the plating layer 14.

The dry film 15 can be irradiated with an ultraviolet beam to obtain an image pattern corresponding to the electronic circuit pattern designed by the image processor 10. A mask film required in the conventional method can be eliminated. For example, a circuit pattern designed by the CAD system can be immediately manufactured as a sample, and the sample can be easily evaluated at the same time.

FIG. 2 shows another embodiment of an ultraviolet radiation projector. In this embodiment, the focusing optical member of the ultraviolet radiation projector 1 is replaced with a lens array.

An ultraviolet radiation projector 1A shown in FIG. 2 comprises a gradient index lens array 16 as a focusing optical member for focusing an image on a panel surface 3b of the CRT 2 onto a projection surface 7. An ultraviolet beam emitted from the panel surface 3b is collimated by the lens array 16, and the collimated beam is projected onto the projection surface 7.

When this lens array 16 is used, the magnification is fixed to one times. However, since the distance between the panel surface 3b and the projection surface 7 can be shortened, the apparatus as a whole can be made compact.

When a close positional relationship between the projection surface 7 and the panel surface 3b of the CRT 2 is expected to adversely affect the photosensitive resin, an appropriate filter member can be arranged between the lens array 16 and the CRT 2 or between the lens array 16 and the projection surface 7 to eliminate unnecessary components (e.g., X-rays) except for the ultraviolet components.

Figure 4:
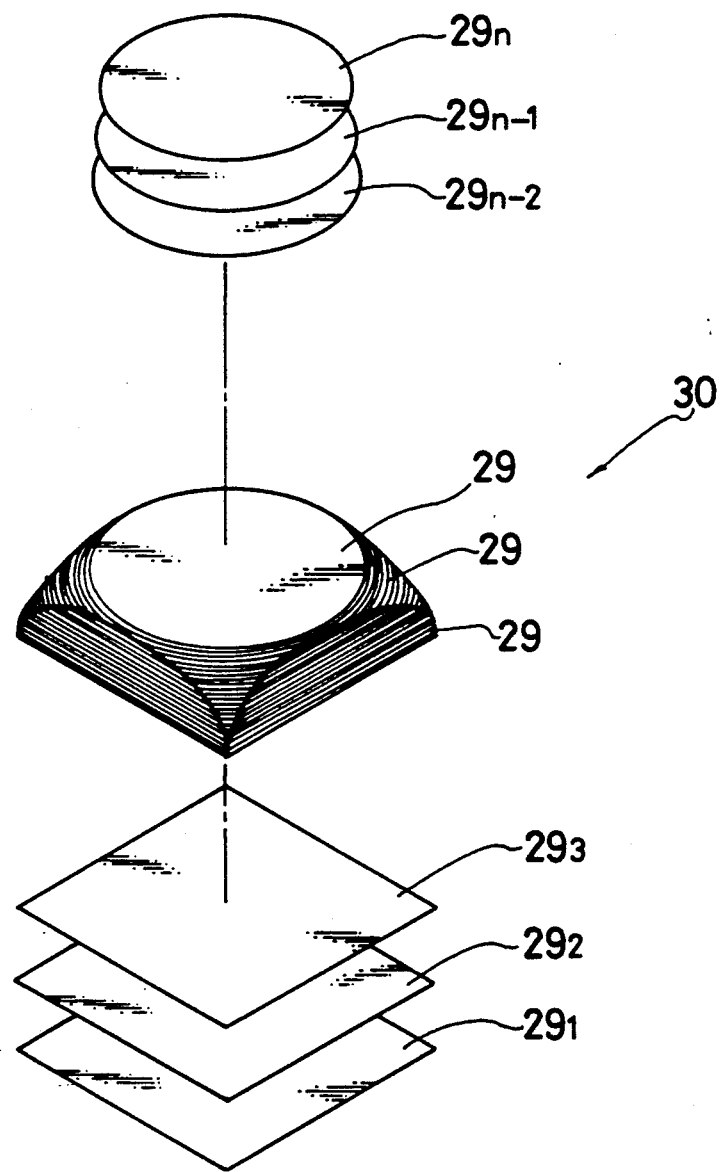
FIG. 4 is an enlarged perspective view of some division sections of a stereoscopic image formed by the optical image forming apparatus shown in FIG. 3.

FIGS. 3 and 4 show a preferred embodiment of a stereoscopic image forming apparatus having the ultraviolet radiation projector 1.

A stereoscopic image forming apparatus 17 shown in FIG. 3 comprises the ultraviolet radiation projector 1, a resin storage tank 18, and an elevator 20. A molten photosensitive resin (liquid) 19 is stored in the resin storage tank 18.

The elevator 20 has a horizontal plate-like stage 21 located at the lower end portion of the elevator 20. A nut member 22 is fixed to the upper end portion of the elevator 20. The nut member 22 is threadably engaged with a feed screw 24 rotated by a stepping motor 23. Upon rotation of the feed screw 24, the nut member 22 is fed, whereby the elevator 20 is vertically moved stepwise. The stage 21 is located in the photosensitive resin 19 stored in the resin storage tank 18.

The ultraviolet radiation projector 1 is located such that an image pattern output from a panel surface 3b of a CRT 2 is focused onto a liquid surface 19a of the photosensitive resin 19 in the resin storage tank 18.

The stereoscopic image forming apparatus 17 also includes a stereoscopic image programming unit (image processor) 25, a controller 26, a display driver 27, and a motor drive circuit 28.

The stereoscopic programming unit 25 is constituted by a CAD system in the same manner as in the image processor 10. Data of a large number of sections are obtained such that a stereoscopic image designed by the stereoscopic programming unit 25 is divided into sections at a predetermined pitch (to be referred to as a division pitch hereinafter) in one direction of the stereoscopic image. These data are output to the controller 26 in the form of video signals, and the video signals are output to an electron gun 4 of the CRT 2.

The motor drive circuit 28 receives a control signal from the controller 26 and outputs predetermined phase excitation signals to the stepping motor 23. Although not shown, a sensor is arranged to detect a position of the elevator 20. A position detection signal from the sensor is output to the controller 26, thereby controlling the position of the elevator 20.

In the image formation mode, an initial position of the elevator 20 is shifted to a position where the photosensitive resin 19 exists on the stage 21 so as to have a thickness corresponding to the one division pitch. At the same time, an image pattern corresponding to the data of the first division section in a large number of division sections is projected onto the liquid surface 19a of the photosensitive resin 19 by the ultraviolet radiation projector 1. The photosensitive resin 19 on the stage 21 is exposed with a pattern corresponding to the first division section to form a sheet-like cured layer $29_1$ as shown in FIG. 4.

The elevator 20 is then moved downward by the one division pitch, and the photosensitive resin 19 flows on the cured layer $29_1$ by a thickness corresponding to the one division pitch. In this state, an image pattern corresponding to the data of the second division section is projected, and the photosensitive resin is exposed with a pattern corresponding to the second division section. Thereafter, a sheet-like cured layer $29_2$ is formed on the cured layer $29_1$.

As shown in FIG. 4, downward movement of the elevator 20 by each division pitch and exposure to the photosensitive resin 19 with a corresponding one of respective division sections are repeated to sequentially stack a large number of cured layers $29_1, 29_2, 29_3, \ldots 29_{n-1}, 29_n$ on the stage 21. Therefore, any stereoscopic image 30 designed by the image processor 25 is formed.

In the electronic circuit pattern image forming apparatus 9 and the stereoscopic image forming apparatus 17, it is important to focus an image pattern formed on the panel surface of the CRT 2 onto the exposure surface in a focused state.

Figure 5:
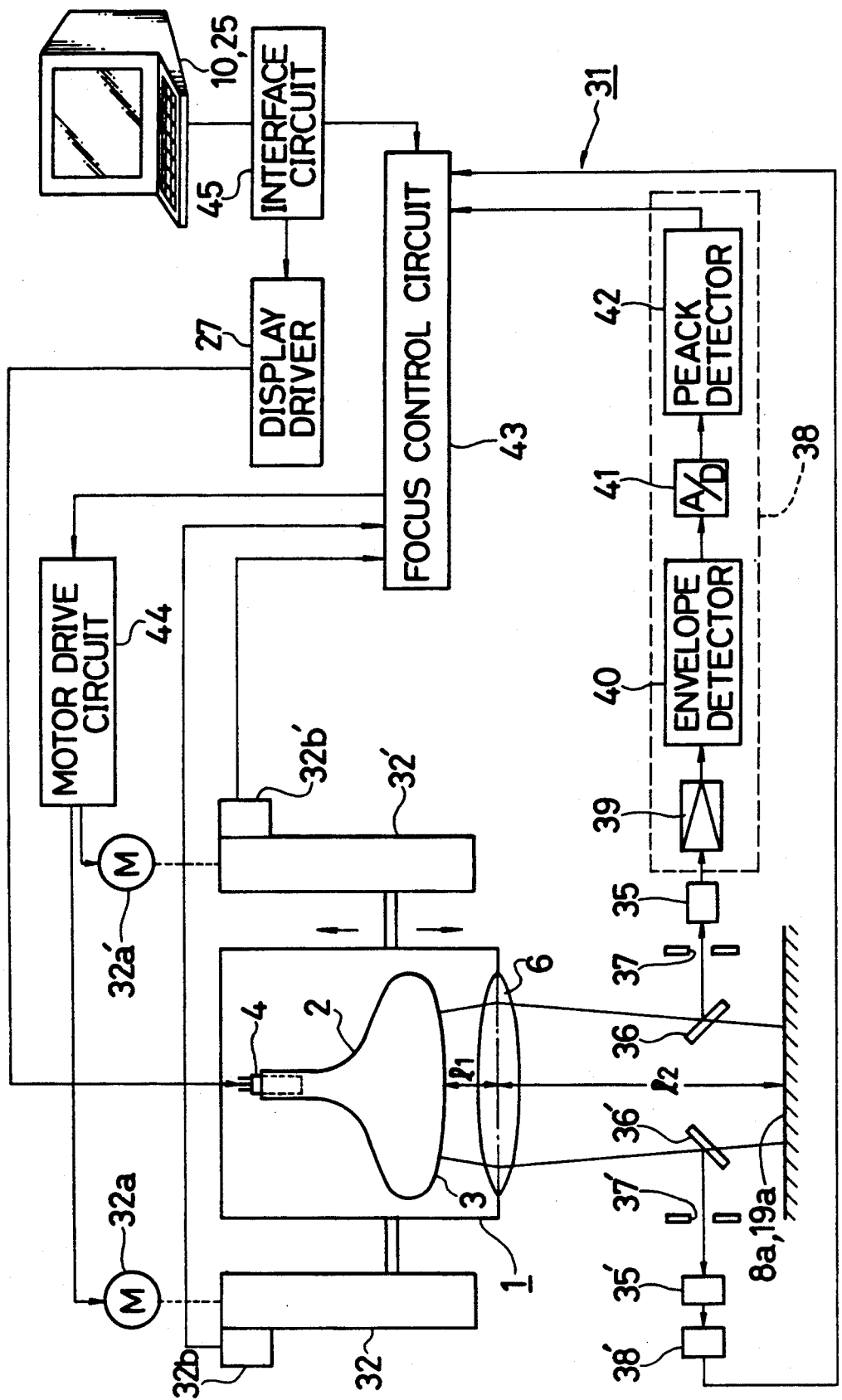
FIG. 5 is a block diagram of an optical image forming apparatus having a focusing mechanism in the apparatuses shown in FIGS. 1 and 3.
Figure 6:
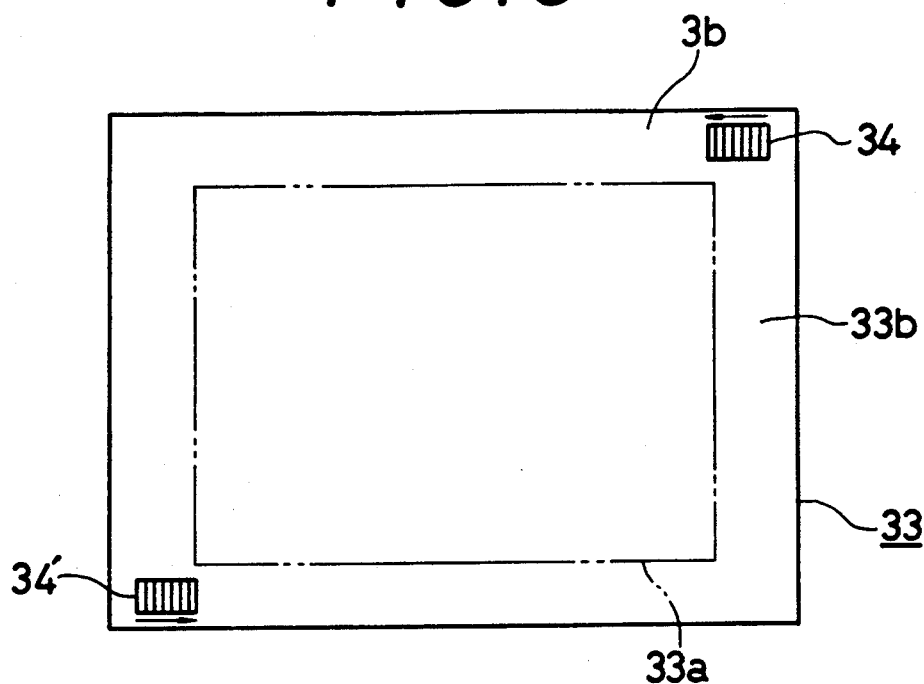
FIG. 6 is a plan view of a panel surface of a CRT with an area for displaying a pattern image on the panel surface of the CRT and an area for displaying a focus adjustment pattern image in the apparatus shown in FIG. 5.

FIGS. 5 to 7 show a focusing mechanism for autofocus adjustment.

As shown in FIG. 5, adjusting factors for performing focus adjustment in the ultraviolet radiation projector 1 are a distance $l_1$ between the projection lens 6 and the panel portion 3 of the CRT 2 and a distance $l_2$ between the projection lens 6 and the exposure surface 8a or 19a. In a focusing mechanism 31 shown in this embodiment, the distance $l_2$ is adjusted while the distance $l_1$ is kept unchanged.

The focusing mechanism 31 shown in FIG. 5 comprises drive mechanisms 32 and 32' as moving means. The drive mechanisms 32 and 32' respectively comprise motors 32a and 32a' and home sensors 32b and 32b' for detecting origin positions in the vertical direction of the ultraviolet radiation projector 1. The ultraviolet radiation projector 1 is moved by the drive mechanisms 32 and 32' in a direction perpendicular to the exposure surface 8a(19a).

As shown in FIG. 6, a predetermined image pattern is displayed in an area 33a except for a peripheral area 33b of an area 33 on the panel surface 3b The area 33a is used as an effective area for forming an electronic circuit pattern or a stereoscopic image pattern.

Figure 7A:
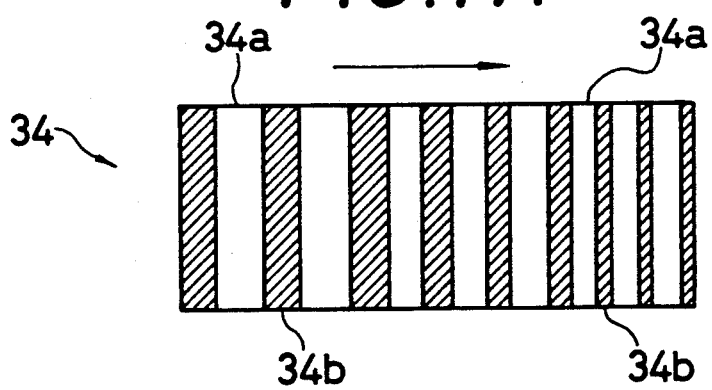
FIG. 7A is a view for visualizing a focus adjustment pattern image in the apparatus shown in FIG. 5.

Focus adjustment pattern images 34 and 34' are displayed in the peripheral area 33b of the area 33 at oblique positions which interpose the area 33a therebetween. Pattern signals for the focus adjustment pattern images 34 and 34' are output from a test signal output means arranged in the stereoscopic image programming unit 25. The focus adjustment pattern images 34 and 34' are formed as a predetermined spatial frequency measurement pattern image in the ultraviolet range or as a spatial frequency measurement pattern image in a predetermined range. As is shown in FIG. 7A, the spatial frequency measurement pattern image (focus adjustment pattern image) 34 has portions 34a each having a high ultraviolet intensity and portions 34b each having a low ultraviolet intensity. The portions 34a and 34b are alternately formed at reduced pitches in a direction indicated by an arrow in FIG. 7A. The focus adjustment pattern images 34 and 34' are moved within the predetermined range of the peripheral area 33b by raster scanning.

The focusing mechanism 31 further comprises photodetectors 35 and 35' located at equivalent positions to the exposure surface 8a or 19a, half mirrors 36 and 36' for guiding the focus adjustment pattern images 34 and 34' to the photodetectors 35 and 35', slits (or pinholes) 37 and 37' located between the half mirrors 36 and 36' and the photodetectors 35 and 35', and a focus control circuit 43.

Figure 7B:
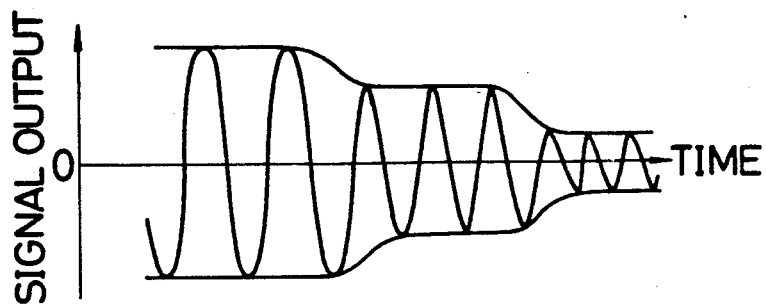
FIG. 7B is a chart showing a signal output from a photodetector in the apparatus shown in FIG. 5.

The focus adjustment pattern images 34 and 34' reach the photodetectors 35 and 35' through the half mirrors 36 and 36' and the slits 37 and 37', respectively. An output signal from the photodetector 35 or 35' has an amplitude which is reduced as the intensity pitch of the focus adjustment pattern image 34 or 34' is reduced (i.e., as the spatial frequency is increased), as shown in FIG. 7B.

Detectors 38 and 38' (although only one detector 38 connected to one photodetector 35 in FIG. 5 is illustrated, an arrangement of the other detector 38' is the same as that of one detector 38) comprises a preamplifier 39 for amplifying the signal from the photodetector 35, an envelope detector 40 connected to the output of the preamplifier 39, an A/D converter 41 for converting a signal from the envelope detector 40 into a digital signal, and a peak detector 42 connected to the output of the A/D converter 41. An output signal from the peak detector 42 is supplied to the focus control circuit 43.

The output signal from the photodetector 35 is preamplified by the preamplifier 39, and the envelope of the amplified signal is obtained by the envelope detector 40. The analog value is converted into a digital signal by A/D converter 41. The peak value of the digital signal is detected by peak detector 42. Therefore, a focusing state is determined by the relationship between the spatial frequency and the degree of amplitude modulation, i.e., an amplitude response, based on the peak value data.

The focus control circuit 43 outputs a control signal to a motor drive circuit 44 in accordance with a detected focusing state, and the motors 32a and 32a' are independently controlled and rotated.

The focus control circuit 43 is operated in response to a focus adjustment start command from the image processor 10 or the stereoscopic image programming unit 25 through an interface circuit 45. The focus control circuit 43 keeps outputting the control signal to the motor drive circuit 44 until the detection signals representing the origin positions are input from the home sensors 32b and 32b'. Therefore, the drive mechanisms 32 and 32' are operated by the motors 32a and 32a' to cause the ultraviolet radiation projector 1 to return to the origin position.

When an exposure operation is started, the ultraviolet radiation projector 1 is moved to the origin position, and then the focus adjustment pattern images 34 and 34' are displayed on the panel surface 3b of the CRT 2 by the display driver 27. The motors 32a and 32a' are driven to move the ultraviolet radiation projector 1 to the exposure surface 8a or 19a. At the same time, the distance $l_2$ is adjusted until a response for high-frequency component is maximized by the detectors 38 and 38' and the focus control circuit 43. When a maximum point of the response for high-frequency component is detected, i.e., when an in-focus state is detected, driving of the motors 32a and 32a' is stopped, and a predetermined image pattern is displayed in the area 33a of the CRT 2. Thereafter, correction for slight variations in a focusing state is always performed under monitoring of the photodetectors 38 and 38'.

The above focus adjustment operations are performed independently based on the two focus adjustment pattern images 34 and 34' displayed on the panel surface 3b of the CRT 2. At the same time, the inclination of the ultraviolet radiation projector 1 with respect to a horizontal plane is also adjusted.

The focus adjustment patterns 34 and 34' are not limited to the particular patterns described above, but may be replaced with pattern images having fixed spatial frequencies, i.e., pattern images having high- and low-ultraviolet intensity portions formed at predetermined pitches. In this case, however, since the amplitude values of output signals are compared with a predetermined reference value, it is troublesomely necessary to correct changes (caused by operation time or the like) in ultraviolet intensity of the CRT. To the contrary, when said spatial frequency pattern images changing within the predetermined range are used, a relative response with reference to a given spatial frequency can be obtained, and the above correction can be eliminated, thus facilitating focus adjustment.

In this embodiment, in order to perform focus adjustment, only the distance $l_2$ between the projection lens 6 and the exposure surface 8a or 19a is adjusted. However, the projection lens 6 may be moved relative to the CRT 2 and the exposure surface 8a or 19a.

What is claimed is:

1. An ultraviolet radiation projector comprising:
   a cathode-ray tube having a phosphor panel surface applied with a phosphor excited upon collision of electron beams from an electron gun to emit an ultraviolet beam having an wavelength of not more than 450 nm; and
   a focusing optical member which is arranged between the phosphor panel surface of the cathode-ray tube and an exposure surface of an ultraviolet sensitive material irradiated with the ultraviolet beam and which is kept separated from the exposure surface, wherein said focusing optical member comprises a gradient index lens array having a predetermined refractive index, and wherein the gradient index lens array has a magnification substantially equal to one and collimates the ultraviolet beam before said ultraviolet beam irradiates the exposure surface.

2. An optical image forming apparatus comprising:
   an ultraviolet radiation projector including a cathode-ray tube having a phosphor panel surface applied with a phosphor excited upon collision of electron beams from an electron gun to emit an ultraviolet beam having a wavelength of not more than 450 nm, and a focusing optical member which is arranged between the phosphor panel surface of the cathode-ray tube and an exposure surface of an ultraviolet sensitive material irradiated with the ultraviolet beam and which is kept separated from the exposure surface, wherein the focusing optical member comprises a gradient index lens array having a predetermined refractive index and a magnification substantially equal to one, and wherein the gradient index lens collimates the ultraviolet beam before said ultraviolet beam irradiates the exposure surface; and
   image processing means for outputting image data corresponding to a predetermined electronic circuit pattern on the cathode-ray tube,
   wherein the electronic circuit pattern is formed on the exposure surface of the ultraviolet sensitive material irradiated with the ultraviolet beam emitted from the cathode-ray tube.

3. An apparatus according to claim 2, wherein said ultraviolet sensitive material comprises a dry film applied on a plating layer formed on a board.

4. An apparatus according to claim 2, further comprising:
   test signal output means for outputting a spatial frequency measurement pattern signal on said cathode-ray tube;
   pattern detecting means for detecting the spatial frequency measurement pattern image emitted from said cathode-ray tube;

driving means for moving said ultraviolet radiation projector or said focusing optical member in a direction perpendicular to said exposure surface of said ultraviolet sensitive material; and a focus control circuit for evaluating spatial frequency characteristics in accordance with an output signal from the pattern detecting means and for outputting a drive control signal to the driving means.

* * * * *